(12) United States Patent
Ohmori (10) Patent No.: US 7,675,671 B2
(45) Date of Patent: Mar. 9, 2010

(54) MICRO ELECTRO MECHANICAL SYSTEMS DEVICE

(75) Inventor: Yasuhiro Ohmori, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 3 days.

(21) Appl. No.: 12/215,401

(22) Filed: Jun. 27, 2008

(65) Prior Publication Data

US 2009/0002798 A1  Jan. 1, 2009

(30) Foreign Application Priority Data

Jun. 29, 2007  (JP) .............................. 2007-173188

(51) Int. Cl.
 *G02B 26/00* (2006.01)
 *G02B 26/12* (2006.01)
(52) U.S. Cl. ................. 359/295; 359/290; 359/291; 359/224; 359/846; 359/872; 385/18; 361/277; 361/278
(58) Field of Classification Search ............... 359/223, 359/224, 225.1, 226.1, 290–293, 295, 846, 359/849, 850, 872; 361/277, 278, 287, 303, 361/816; 385/15–18; 438/31, 50, 51, 65, 438/694; 720/695; 216/13, 24; 427/58, 427/162
See application file for complete search history.

(56) References Cited

U.S. PATENT DOCUMENTS

| 5,920,978 | A | 7/1999 | Koshikawa et al. |
| 6,649,987 | B1 * | 11/2003 | Staker et al. ................. 257/417 |
| 6,888,662 | B2 * | 5/2005 | Abu-Ageel .................. 359/290 |
| 7,215,061 | B2 | 5/2007 | Kihara et al. |
| 7,467,948 | B2 * | 12/2008 | Lindberg et al. .............. 439/38 |
| 2004/0114942 | A1 * | 6/2004 | Yee et al. ..................... 398/214 |
| 2006/0203319 | A1 | 9/2006 | Kouma et al. |
| 2009/0180169 | A1 * | 7/2009 | Moidu et al. ............. 359/225.1 |

FOREIGN PATENT DOCUMENTS

| JP | 3290569 | 3/2002 |
| JP | 2005-271191 | 10/2005 |
| JP | 2006-247793 | 9/2006 |

* cited by examiner

*Primary Examiner*—Loha Ben
(74) *Attorney, Agent, or Firm*—Staas & Halsey LLP (57) ABSTRACT

An aspect of the embodiment, a MEMS device includes a rotating unit, a first hinge, a first frame and an actuator. The actuator has a plurality of electrodes for rotating the rotating unit. The first frame has one of the electrodes. A portion of silicon layer by the electrode of the frame is chamfered.

10 Claims, 9 Drawing Sheets

PRIOR ART

FIG. 6D

PRIOR ART

FIG. 6E

PRIOR ART

MICRO ELECTRO MECHANICAL SYSTEMS DEVICE

BACKGROUND

1. Field

An aspect of the art of the invention relates to Micro Electro Mechanical Systems (MEMS) device.

2. Description of the Rerated Art

An optical switch used for optical systems, such as OADM (Optical Add Drop Multiplexing), is a key device that is advantageous in high speed and reduction in number of parts because of a switching operation with direct light without conversion into an electric signal. In particular, small size and integration are possible for a multi-channel micro-mirror device using a micro-machine technology, which is actively developed by companies.

Specifically, an optical switch using a Vertical-MEMS device with a silicon on insulator (SOI) substrate has been developed. Japanese Laid-open Patent Publication No. 2006-247793 (Patent Document) discuss that the use of a vertical comb electrode as an actuator enables a large deflection angle with a low voltage in the MEMS device.

Figure 6A:
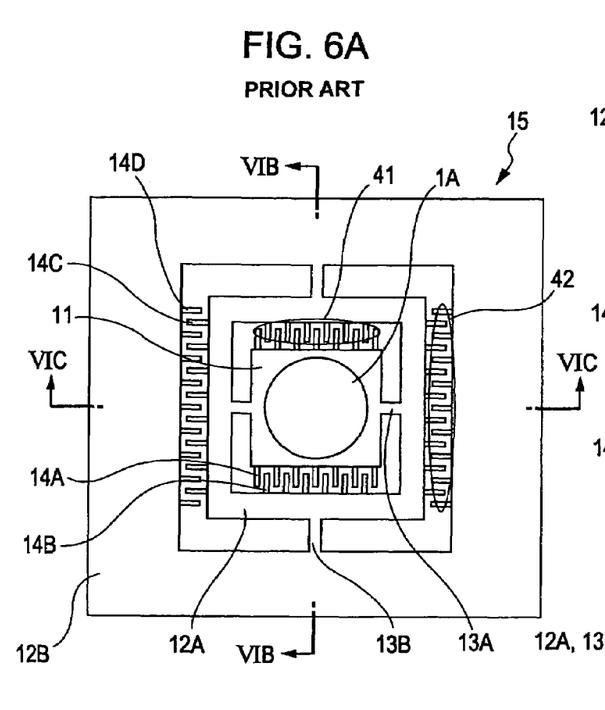
FIGS. 6A to 6E are a diagram showing examples of the structure of a conventional MEMS device.
Figure 6B:
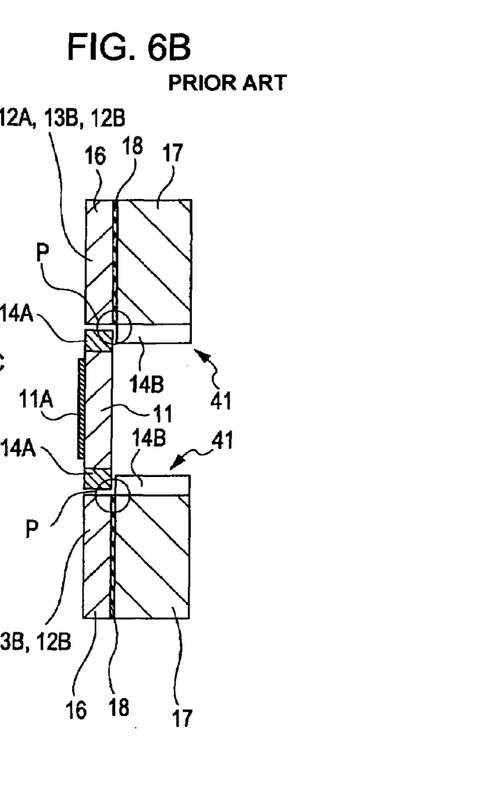
Figure 6C:
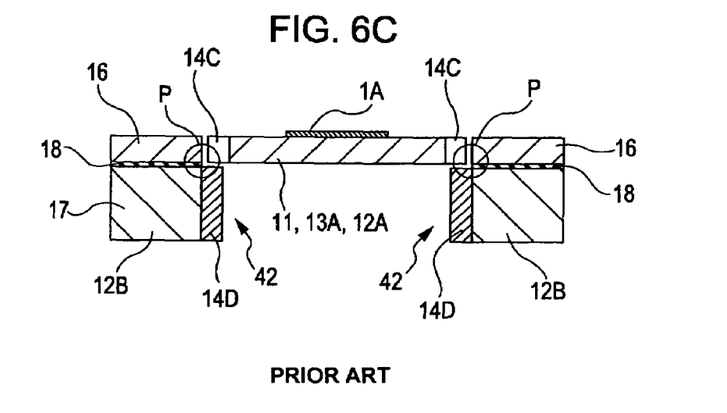
Figure 6D:
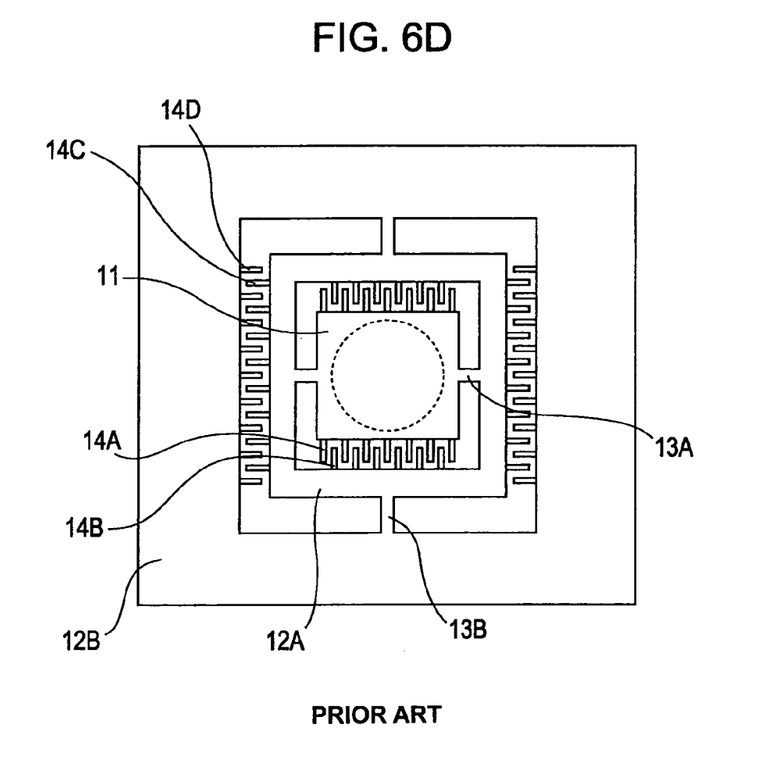
Figure 6E:
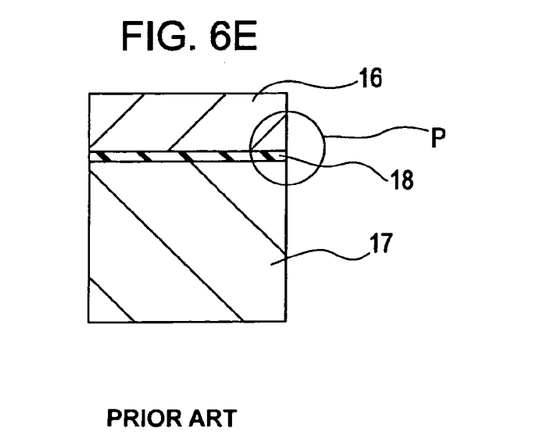

FIGS. 6A to 6E are a diagram showing examples of the structure of a conventional MEMS device, FIG. 6A is a top view thereof, FIG. 6B is a cross-sectional view with AA in FIG. 6A, FIG. 6C is a cross-sectional view with BB in FIG. 6A, FIG. 6D is back view thereof, and FIG. 6E is an enlarged view of a portion P in FIG. 6B and FIG. 6C. An MEMS device 15 shown in FIG. 6A to FIG. 6D comprises a rotating unit 11 having a mirror 11A, frames 12A and 12B, a hinge 13A that connects the rotating unit 11 to the frame 12A, a hinge 13B that connects the frames 12A and 12B, and comb electrodes 14A to 14D that receive voltages for generating electrostatic force.

As shown in FIG. 6B and FIG. 6C, the MEMS device 15 is shaped by processing an SOI substrate structured by sandwiching an insulating layer 18 containing $SiO_2$ by two silicon layers 16 and 17, with an etching technology, etc. As shown in FIG. 6A-6E, the rotating unit 11 and the hinge 13A comprise an insulating layer 16, the frame 12A comprises the silicon layer 16 and further partially comprises a silicon layer 17 and the insulating layer 18, and the hinge 13B and the frame 12B comprise the silicon layers 16 and 17 and the insulating layer 18.

The hinge 13A supports the rotating unit 11 so as to enable the rotation of the rotating unit 11 around the hinge 13A as an axis thereof by electrostatic force produced with voltages applied to electrodes 14A and 14B, which will be described later. The hinge 13B supports the frame 12A so as to enable the rotation of the rotating unit 11 around the hinge 13B as an axis thereof together with the frame 12A and the hinge 13A by electrostatic force produced by electrical fields applied to electrodes 14C and 14D, which will be described later.

The two comb electrodes 14A and 14B (or comb electrodes 14C and 14D) with arrangement of a plurality of combs in facing directions are formed onto the upper and lower silicon layers 16 and 17 in the diagram, thereby structuring vertical-comb electrode actuators 41 (42). In this case, as shown in FIG. 6A to FIG. 6D, the comb electrode 14A is formed on side surfaces of the silicon layer 16 of both edge areas of the rotating unit 1 facing the silicon layer 16 of the first frame 12A with arrangement of a plurality of combs directed to the frame 12A side in the direction of an AA' axis (top side and bottom side), the comb electrode 14B is formed on side surfaces of the silicon layer 17 forming the frame 12A with arrangement of a plurality of combs in facing directions of the combs of the comb electrode 14A, and a comb electrode actuator 41 is formed a pair of the comb electrode 14A and the comb electrode 14B (refer to FIG. 6B).

Similarly, as shown in FIG. 6A to FIG. 6D, the comb electrode 14C is formed on side surfaces of the silicon layer 16 of both edge areas of the first frame 12A facing the second frame 12B with arrangement a plurality of combs directed to the frame 12B side in the direction of an axis BB' (left side and right side), the comb electrode 14D is formed on side surface of the silicon layer 17 of the both edge areas of the second frame 12B facing the first frame 12A with arrangement of a plurality of combs in facing directions of the combs of the comb electrode 14C, and a comb electrode actuator 42 comprises a pair of the comb electrode 14C and the comb electrode 14D (refer to FIG. 6C).

Herein, the vertical-comb electrode actuator 41 is formed on both sides of the rotating unit 1 in the direction of the AA' axis, and a voltage is supplied with a cooperative operation. Namely, the rotating unit 1 is rotated only at an angle corresponding to the electrostatic force generated by supply voltages around the hinge 13A as the rotating axis formed-along the BB' axis. Similarly, the vertical-comb electrode actuator 42 is formed on both sides of the rotating unit 1 in the direction of the axis BB', and a voltage is supplied with a cooperative operation. Namely, the rotating unit 1 is rotated together with the frame 12A and the hinge 13A only at an angle corresponding to the electrostatic force generated by supply voltages around he hinge 13B as the rotating axis formed along the AA' axis. As a consequence, an angle of the mirror 11A formed to the rotating unit 1 is given and a reflection angle of light incident on the mirror 11A can be deflected depending on the angle of the mirror 11A.

However, in the MEMS device 1 with the above-mentioned structure, the upper and lower comb electrodes 14A and 14B (14C and 14D) sandwiching the insulating layer 8 generally have the potential difference therebetween. FIG. 6E is an enlarged view of a boundary part between the silicon layers 16 and 17 sandwiching the insulating portion 18 on the frames 12A and 12B where the electrodes 14B and 14D are formed on the silicon layer 17. Referring to FIG. 6E, via the insulating layer 18, there is the potential difference between the upper silicon-layer 6 in the drawing and the silicon layer 17 where the electrodes 14B and 14D are formed.

The insulating layer 18 usually comprises a greatly thin film of 1 μm or less. When there is the potential difference between the silicon layers 16 and 17 via the insulating layer 18 as the thin film, electric discharge is easily generated on the insulating layer 18. When the electric discharge is generated between the silicon layers 16 and 17, the electrostatic force to be generated is changed. Thus, there is a problem of deterioration in stability of the rotating operation of the rotating unit 11, i.e., stability of the angle setting of the mirror 11A.

At this point, the increase in thickness of the insulating layer 18 can suppress the generation of the electric discharge. However, as the insulating layer 18 is thicker, the thickness is distributed. Further, the warpage of the wafer itself, as the base of the SOI substrate becomes large, and there can be thus a trouble upon manufacturing the device with high quality. Alternatively, the potential difference applied to the comb electrodes 14B and 14D can be also reduced as a countermeasure for suppressing the electric discharge. Primarily, if the potential difference is not fully applied, a required inclination angle of the mirror 11A cannot be obtained.

Patent Document discusses the technology for improving the alignment accuracy upon forming the pair of comb electrodes. However, the technology for suppressing the electric discharge generated as mentioned above is not disclosed.

SUMMARY

Accordingly, it is an object of the one of embodiment of the invention to provide an MEMS device with the structure for suppressing the generation of the electric discharge.

According to an aspect of the embodiment, a MEMS device includes a rotating unit, a first hinge, a first frame and an actuator. The actuator has a plurality of electrodes for rotating the rotating unit. The first frame has one of the electrodes. A portion of silicon layer by the electrode of the frame is chamfered.

Additional objects and advantages of the invention will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF THE PREFERRED EMBODIMENT

Hereinbelow, a description will be given of embodiments of the present invention with reference to the drawings.

Incidentally, the present invention is not limited to the following embodiments. Further, in addition to the object of the preset invention, the disclosure according to the following embodiments can make, obvious, another technological problem, means for solving the technological problem, operations, and advantages.

[A] Explanation of First Embodiment

Figures 1A, 1B:
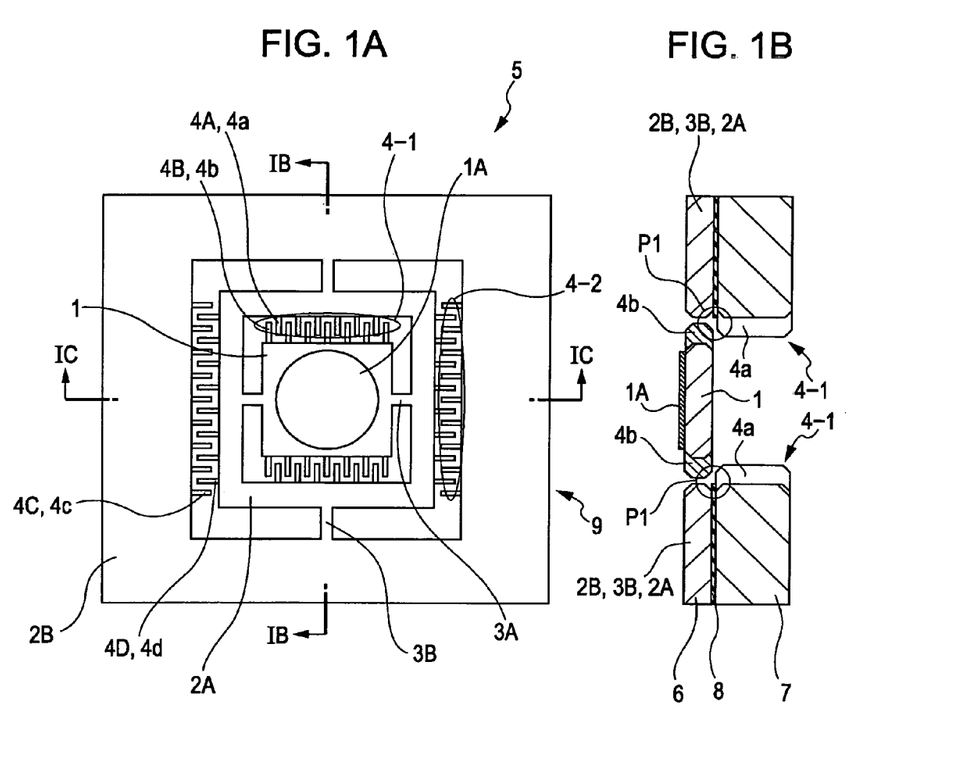
FIGS. 1A to 1E are a diagram showing an MEMS device according to the first embodiment of the present invention.
Figure 1C:
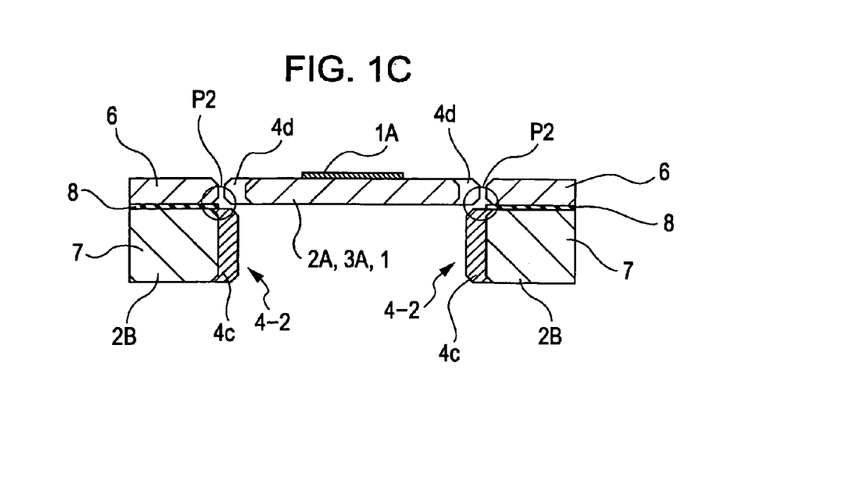
Figure 1D:
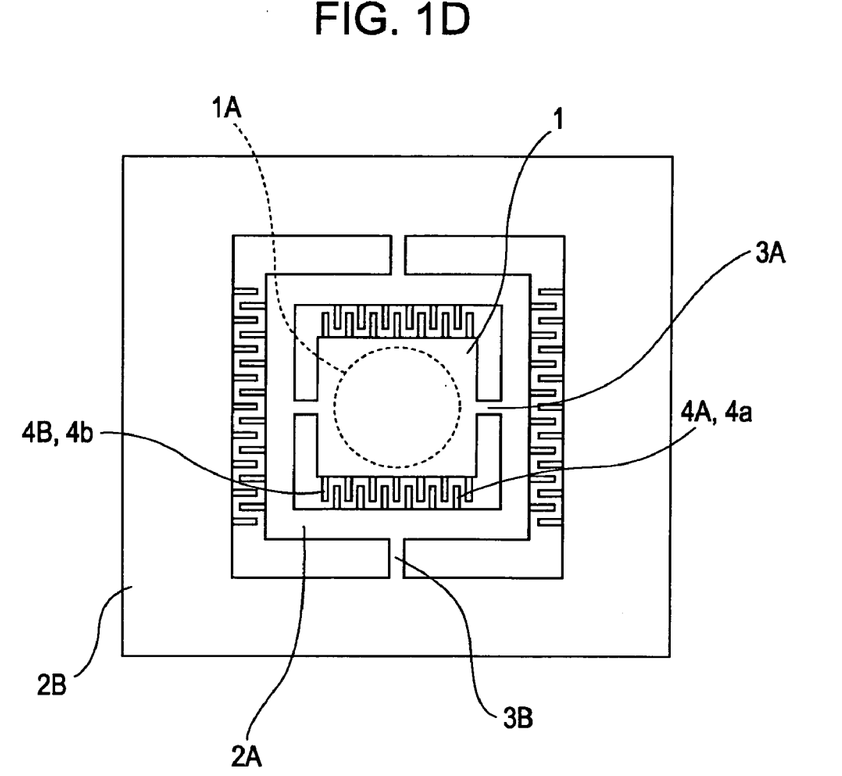
Figure 1E:
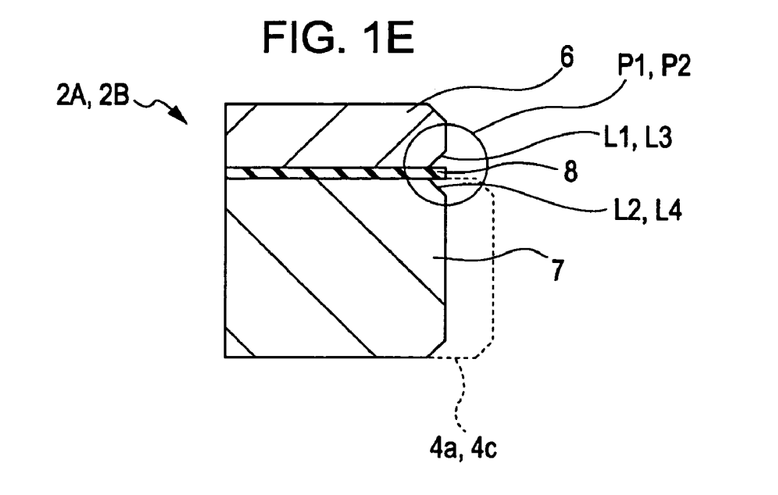

FIGS. 1A to 1D are a diagram showing an MEMS device 5 according to the first embodiment of the present invention, FIG. 1A is a top view thereof, FIG. 1B is a cross-sectional view with AA' in FIG. 1A, FIG. 1C is a cross-sectional view with BB' in FIG. 1A, FIG. 1D is a back view thereof, and FIG. 1E is an enlarged view of portions P1 and P2 in FIGS. 1B and 1C. In the MEMS device 5 shown in FIGS. 1A to 1D, a substrate 9 formed by laminating a first silicon layer 6, a second silicon layer 7, and an insulating layer 8 containing, e.g., $SiO_2$ between the first and second silicon layers 6 and 7 comprises a rotating unit 1 having a mirror 1A, first and second frame portions 2A and 2B, and first and second hinge portions 3A and 3B that are shaped.

The MEMS device 5 according to the first embodiment can be applied as a component of an optical switch used for optical systems, such as OADM (Optical Add Drop Multiplexing), similarly to that shown FIGS. 6A to 6E as mentioned above. Specifically, incident light is reflected by the mirror 1A, the rotating unit 1 is rotated by electrostatic force generated by voltages supplied to comb electrodes 4A to 4D, and a reflection angle of the mirror 1A is varied, thereby switching optical paths of the reflection light. Referring to FIG. 1, the reflection angle of one mirror 1A is switched. Alternatively, upon applying the MEMS device 5 to the optical switch, a large number of the same structures are integrated and arranged like an array.

Herein, the rotating unit 1 is shaped by removing a portion other than the silicon layer 6 in the center of the substrate 9 in the drawing, and the mirror 1A is formed onto the upper surface of the substrate 9. A portion other than the silicon layer 6 is removed so as to support both sides of the rotating unit 1 along a BB' axis in FIG. 1A, thereby shaping the first hinge portion 3A. Hence, the rotating unit 1 is rotatable around the first hinge portion 3A as the axis thereof.

The first frame portion 2A supports the first hinge portion 3A as a component forming the first silicon layer 6. The first frame portion 2A surrounds the outer circumference of the rotating unit 1, and comprises a comb electrode 4A, which will be described late, having the second silicon layer 7 as a component. Further, the second hinge portion 3B supports the first frame portion 2A so as to rotate the rotating unit 1 together with the first frame portion 2A and the first hinge portion 3A.

The second frame portion 2B supports the second hinge portion 3B, surrounds the outer circumference of the first frame portion 2A, and is formed integrally with first and second silicon layers 6 and 7 and the insulating layer 8. Incidentally, as shown in FIGS. 1A to 1D, the second hinge portion 3B is formed integrally with the second frame portion 2B, the first and second silicon layers 6 and 7, and the insulating layer 8. However, in order to increase the rotation angle corresponding to the electrostatic force, the second hinge portion 3B may be shaped by partly removing the second silicon layer 7 or by removing a portion other than the silicon layer 6 similarly to the first hinge portion 3A.

Herein, the MEMS device 5 according to the first embodiment comprises first and second actuators 4-1 and 4-2 for generating the electrostatic force to rotate the rotating unit 1. The first actuator 4-1 generates the electrostatic force (in the vertical direction to the substrates face) for rotating the rotating unit 1 around the first hinge portion 3A as an axis thereof with the voltage supplied. Further, the second actuator 4-2 generates the electrostatic force (in the vertical to the substrates face) for rotating the rotating unit 1 around the second hinge portion 3B as an axis thereof (together with the first frame portion 2A and the first hinge portion 3A) with the voltage supplied.

Therefore, the first actuator 4-1 includes, as a first electrode portion, the first comb electrode 4a and the second comb electrode 4b. The first comb electrode 4a is formed on side surfaces of the second silicon layer 7 of both edge areas of the first frame 2A facing the first silicon layer 6 of the rotating unit 1. Further, the second comb electrode 4b is formed on side surface of the silicon layer 6 of the both edge of the rotating unit 1 facing the first silicon layer 6 of the first frame 2A. A plurality of combs 4a directed to the rotating unit 1 are arranged to the first comb electrode 4b. A plurality of combs 4b are arranged between the combs 4a that are directed to the first frame portion 2A and form the first comb electrode 4A.

Accordingly, a voltage is applied so as to cause the potential difference between the first and second comb electrodes 4A and 4B as a pair of electrodes facing each other. Then, since electrostatic force occurs with the potential difference, the first and second comb electrodes 4A and 4B can draw near mutually. On the other hand, in a state in there is no potential difference, the first and second comb electrodes 4A and 4B are returned to the original state with elastic force caused by the first hinge portion 3A.

In other words, the first and second comb electrodes 4a and 4b as the first electrode portion and the third and fourth comb electrodes 4c and 4d as the second electrode portion are arranged in the direction substantially perpendicular to each other, the first and second comb electrodes 4a and 4b as the first electrode portion are arranged in the direction substantially perpendicular to an axis of the hinges 3A's holding the rotating unit 1. Incidentally, in the MEMS device 5 according to the first embodiment, the pair of the first and second comb electrodes 4A and 4B is formed on the both sides of the rotating unit 1 and, with the first and second comb electrodes 4A and 4B on both the sides thereof, the rotating unit 1 can be rotated so as to deflect the reflection light on both up-and-down sides of the BB' axis in FIG. 1A.

Further, the second actuator 4-2 comprises as a second electrode portion, the third comb electrode 4c and the fourth comb electrode 4d. The third comb electrode 4c is formed on side surface of the second silicon layer 7 of both of the edge areas of the second frame portion 2B facing the first frame portion 2A side. Further, the fourth comb electrode 4d is formed on side surface of the first silicon layer 6 of both of the edge areas of the first frame portion 2A facing the second frame portion 2B side. A plurality of combs 4c directed to the first frame portion 2A side are arranged to the third comb electrode 4C. The fourth comb electrode 4D is formed to the first frame portion 2A, and comprises a plurality of combs 4d arranged between the combs 4c that are directed to the second frame portion 2B and form the third comb electrode 4C. Voltage are applied to the pair of the third and fourth comb electrodes 4C and 4D facing each other so as to cause the potential difference. Then, since electrostatic force occurs with the potential difference between the third and fourth comb electrodes 4C and 4D, the third and fourth comb electrodes 4C and 4D can draw near mutually. On the other hand, in a state in which there is no potential difference, the third and fourth comb electrodes 4C and 4D are returned to the original state with elastic force caused by the second hinge portion 3B.

Like the first actuator 4-1, the pair of the third and fourth comb electrodes 4C and 4D as the second actuator 4-2 is formed on the both sides of the rotating unit 1. Therefore, the third and fourth comb electrodes 4C and 4D on both sides thereof enable the rotation of the rotating unit 1 so as to make it possible to deflect the reflection light on both left and right sides-with the axis AA' in FIG. 1A.

Incidentally, in viewpoint of efficiency for the rotating operation of the rotating unit 1 and pull-in (contact of the combs 4a to 4d) of the actuators 4-1 and 4-2, preferably, the combs 4a to 4d forming the first to fourth comb electrodes 4A to 4D are projected in the vertical direction with respect to the first and second frame portions 2A and 2B and the cut-out surface of the rotating unit 1. Usually, the mirror 1A as well as the frames 2A and 2B and the hinges 3A and 3B except for the first to fourth comb electrodes 4A to 4D is also etched with RIE (Reactive Ion Etching) and vertical etching is therefore performed.

Further, in the MEMS device 5 according to the first embodiment, as shown in FIG. 1E, in the edge area having the first comb electrode 4A as the first actuator 4-1 in the first frame portion 2A, a first boundary part L1 between the first silicon layer 6 and the insulating layer 8, and a second boundary part L2 between the second silicon layer 7 and the insulating layer 8 are chamfered. Similarly, in the edge area having the second actuator 4-2 in the second frame portion 2B, a third boundary part L3 between the first silicon layer 6 and the insulating layer 8 and a fourth boundary part L4 between the second silicon layer 7 and the insulating layer 8 are chamfered.

Similarly to FIGS. 6A to 6D, in the MEMS device 5 shown in FIGS. 1A to 1E, the upper and lower comb electrodes 4A and 4B (4C and 4D) sandwiching the insulating layer 8 have the potential difference. However, since the boundary parts L1 to L4 via the insulating layer 8 are chamfered, sharpened portions do not face on the insulating layer unlike the case shown in FIG. 6E. As shown in FIG. 6A to 6E, the electric discharge is easily caused when the sharpened portions are close and face each other.

On the other hand, as shown in FIGS. 1A to 1D, also upon applying a voltage to the first comb electrode 4A forming the second silicon layer 7, by chamfering the first boundary part L1 as the boundary surface between the insulating layer and the first silicon layer 6 forming the first frame portion 2A close thereto, the generation of the electric discharge can be suppressed, as compared with the above-mentioned case shown in FIGS. 6A to 6E. Further, upon applying a voltage to the third comb electrode 4C, by chamfering the third boundary part L3 as the boundary surface between the insulating layer and the first silicon layer 6 forming the second frame portion 2A close thereto, the generation of the electric discharge can be suppressed, as compared with the above-mentioned case shown in FIGS. 6A to 6E.

Furthermore, as shown in FIG. 1E, the portions sandwiched by the boundary parts L1 to L4 subjected to the chamfering on the insulating layer 8 are projected from the first and second silicon layers 6 and 7, and are extended to the rotating unit 1 side. That is, the insulating layer 8 in the edge area having the first actuator 4-1 on the first frame portion 2A is extended to the rotating unit 1 side rather than the first and second boundary parts L1 and L2 chamfered. Further, the insulating layer 8 in the edge area having the second actuator 4-2 on the second frame portion 2B is extended to the rotating unit 1 side rather than the third and fourth boundary parts L3 and L4 chamfered.

Accordingly, upon applying the potential difference between the first and second silicon layers 6 and 7 that are mutually close to each other, sandwiching the insulating layer 8, the boundary parts L1 to L4 are chamfered and the insulating layer 8 is further extended. Therefore, the insulating advantage can be improved and the electric discharge can be more effectively suppressed.

FIGS. 2A to 2F are diagrams for illustrating a manufacturing method of the MEMS device 5 having the above-mentioned structure, corresponding to a cross-section shown by the arrow BB' in FIGS. 1A to 1D. First, a metallic film as a circuit pattern used for controlling the mirror 1A and the operation for applying voltages to the first to fourth comb electrodes 4A to 4D is deposited to the SOI substrate 9 as a material substrate with EB (Electron Beam) vapor deposition. Thereafter, the SOI substrate 9 is desirably patterned with lithography (refer to FIGS. 2A and 2B). Lift-off may be used for this.

Figures 2A, 2B:
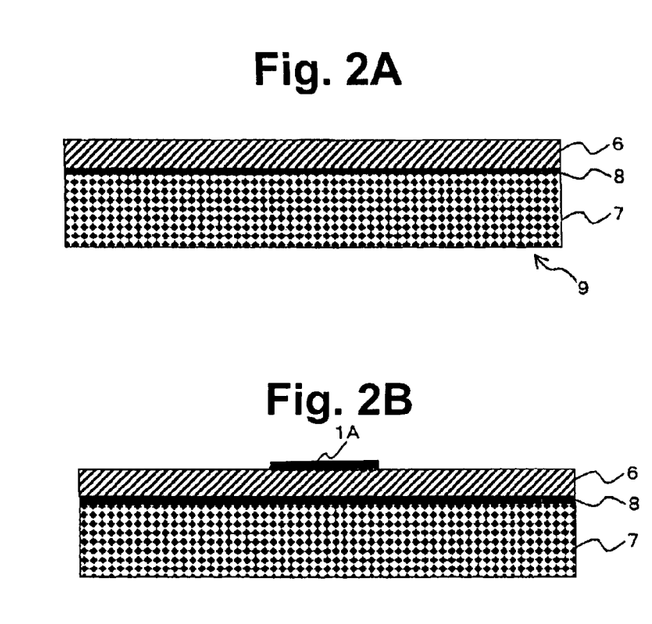
FIGS. 2A to 2F are diagrams for explaining manufacturing processing of the MEMS device according to the first embodiment.
Figure 2C:
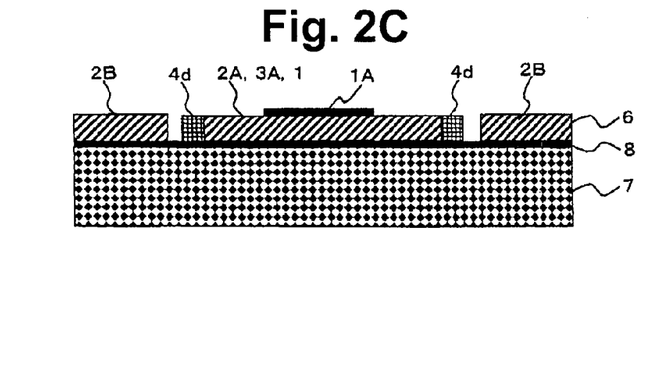

That is, on the first silicon layer 6 side of the SOI substrate 9, a first pattern is set to form the rotating unit 1, the first and second frame portions 2A and 2B, and the first and second hinge portions 3A and 3B. Further, on the second silicon layer side thereof, at least the second silicon layer 7 is removed from the rotating unit 1, and a pattern for forming the first and second frame portions 2A and 2B and the second silicon layer 7 forming the second hinge portion 3B is set as a second pattern. The second pattern includes, as a component of the second silicon layer 7 forming the first frame portion 2A, a pattern that forms the first comb electrode 4A forming the first actuator for generating the electrostatic force to rotate the rotating unit 1 with the supply voltage.

For the first pattern exposed from the first silicon layer 6, forming patterns as the second and fourth electrodes 4B and 4D are set. Further, for the second pattern, forming patterns as the first and fourth comb electrodes 4A and 4C are set. With etching, the first pattern for the first silicon layer 6 and the second pattern for the second silicon layer 7 are subsequently shaped. Specifically, a metal mask for etching or an $SiO_2$ mask are film-formed, and the rotating unit 1, the first and second frame portions 2A and 2B, the first and second hinge portions 3A and 3B, and the first to fourth comb electrodes 4A-4D are shaped in a lump (in FIGS. 2C and 2D). In FIGS. 2A to 2F, shaping processing corresponding to the first pattern is performed with etching from the first silicon layer 6, and shaping processing corresponding to the second pattern is performed with etching from the second silicon layer 7.

Figures 2D, 2E:
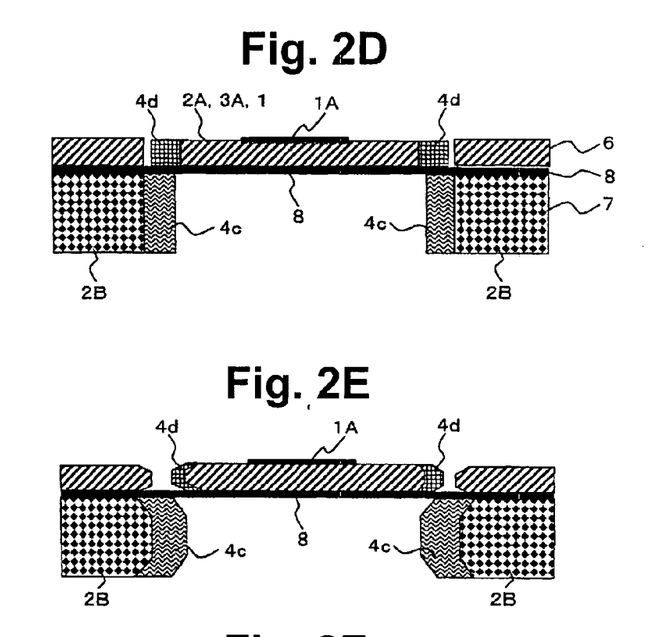

Wet etching using the anisotropy of silicon is thereafter performed with anisotropy etchant, such as KOH, thereby chamfering the boundary parts (the first to fourth boundary parts L1 to L4 shown in FIG. 1E) with insulating layer 8 on the cut-out surfaces of the forming portions of the first to fourth boundary parts L1-L4 on the first and second silicon layers 6 and 7 (in FIG. 2E).

Figure 3:
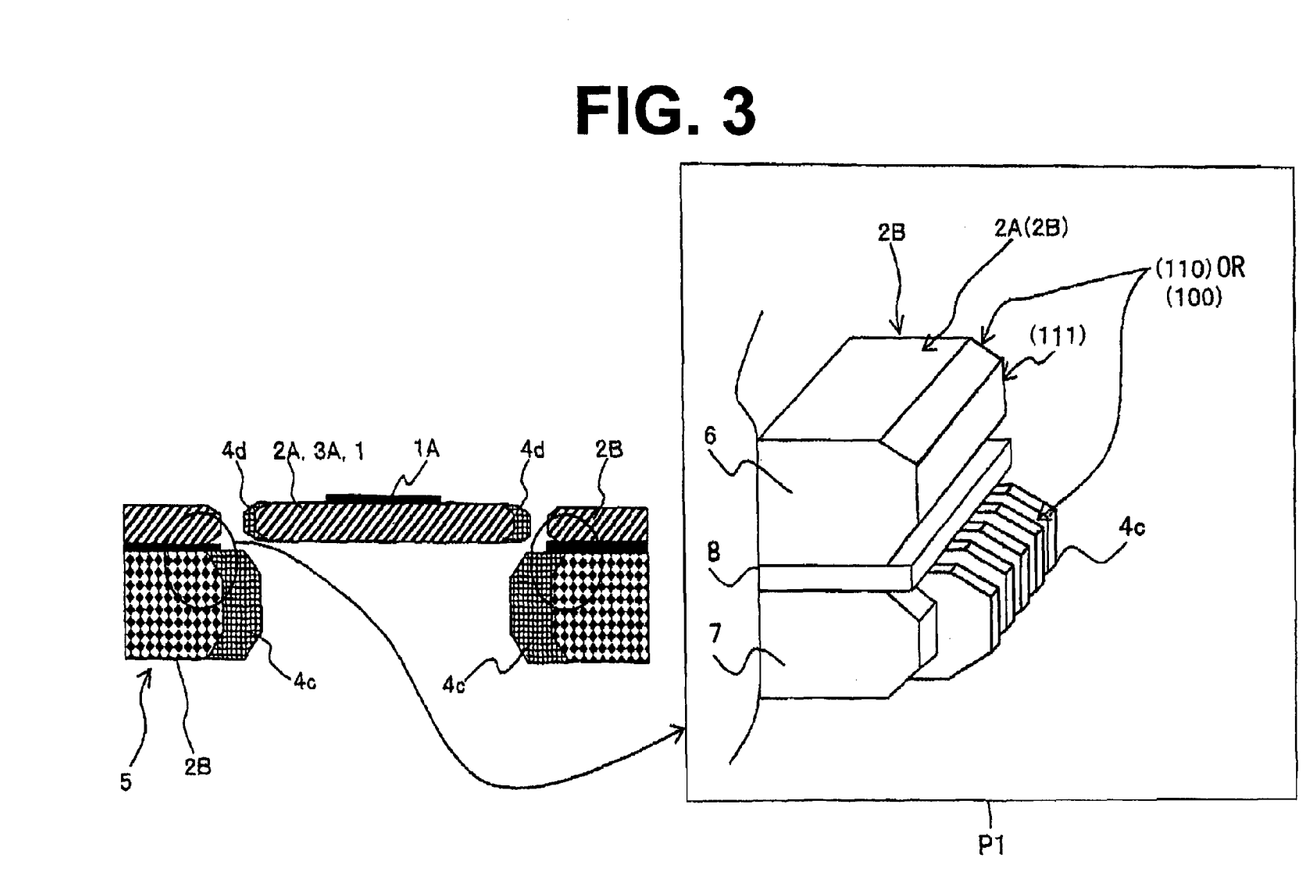
FIG. 3 is a schematic diagram for enlarging and showing a part of the MEMS devices according to the first embodiment of the present invention.

That is, for the SOI substrate 9, as schematically shown in FIG. 3 by paying attention to the portion P1 in FIG. 1C, with respect to the components forming the MEMS device 5 cut-out with etching, the substrate surface is cut-out so as to set the surface where the etching speed is relatively high in the surface direction for chamfering the boundary parts L1 to L4. As shown in FIG. 3, a surface (100) or surface (110) where the etching speed is relatively high is set in the surface direction for chamfering. A surface (111) where the anisotropic etching speed is relatively slow is set in the cut-out surface direction of the first and second frame portions 2A and 2B (or the projecting direction of the combs 4a to 4d).

Incidentally, the chamfering surfaces at the forming portions of the first and second comb electrodes 4A and 4B structuring the first actuator 4-1 are substantially vertical to the chamfering surfaces at the forming portions of the third and fourth comb electrodes 4C and 4D structuring the second actuator 4-2. However, even if assuming that the first and second silicon layers 6 and 7 forming the SOI substrate 9 have a uniform crystallographic-axis arrangement, it is possible to perform the chamfering substantially at the same etching speed with processing of the identical anisotropic etching.

The etching using the anisotropy of silicon is performed to the fundamental structure having the MEMS device 5 shaped with the etching by selecting the SOI substrate 9, thereby chamfering the boundary parts L1 to L4.

Figure 2F:
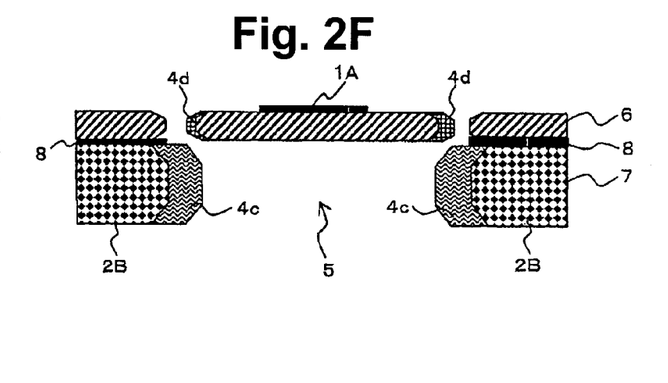

Thereafter, dry etching from the first silicon layer 6 removes the insulating layer 8 remaining between the first and second frame portions 2A and 2B and between the first frame portion 2A and the rotating unit 1. Further, dry etching from the first silicon layer 7 removes the insulating layer 8 remaining at the forming portion of the rotating unit 1 (FIG. 2F).

In the MEMS device 5 with the above structure, by applying the voltage to the first comb electrode 4A formed on the second silicon layer 7, the electrostatic force is produced with the potential difference between the first comb electrode 4A and the second comb electrode 4B, thereby rotating the rotating unit 1 around the BB' axis in FIGS. 1A to 1D. Similarly, by applying the voltage to the third comb electrode 4C, the electrostatic force is produced with the potential difference between the third comb electrode 4C and the fourth comb electrode 4D, thereby rotating the rotating unit 1 around the AA' axis in FIGS. 1A to 1D.

At the time, for the boundary part L1 between the insulating layer 8 and the edge area of the first silicon layer 6 in the first frame portion 2A close to the first comb electrode 4A and the boundary part L2 between the insulating layer 8 and the edge area of the second silicon layer 7 in the first comb electrode 4A, the corners cut-out with etching are chamfered, thereby suppressing the generation of the electric discharge upon applying the voltage, as compared with the case using the conventional art.

For the boundary part L3 between the insulating layer 8 and the edge area of the first silicon layer 6 in the second frame portion 2B close to the third comb electrode 4C and the boundary part L4 between the insulating layer 8 and the edge area of the second silicon layer 7 in the third comb electrode 4C, the corners cut-out with etching are chamfered, thereby suppressing the generation of the electric discharge upon applying the voltage, as compared with the case using the conventional art.

According to the first embodiment of the present invention, in the edge area of the first frame portion 2A having the first actuator 4-1, the first boundary part L1 between the first silicon layer 6 and the insulating layer and the second boundary part L2 between the second silicon layer 7 and the insulating layer 8 are chamfered. Therefore, advantageously, it is possible to suppress the generation of the electric discharge caused by the voltage applied upon operating the actuator 4-1 while avoiding the contact state between the first to fourth comb electrodes 4A to 4D, to improve the stability of the rotating operation of the rotating unit 1, and to further improve the stability of angle setting of the mirror 1A.

Further, the insulating layer 8 is extended to the boundary parts L1 to L4 chamfered. Therefore, advantageously, it is possible to improve the insulating advantage and suppress the above-mentioned electric discharge more effectively.

Figure 4A:
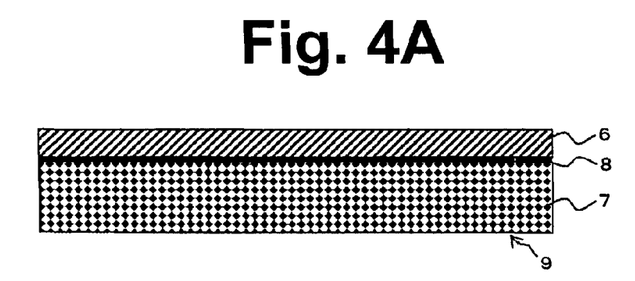
FIGS. 4A to 4F are diagrams for explaining a modification of the manufacturing processing of the MEMS device according to the first embodiment.
Figure 4B:
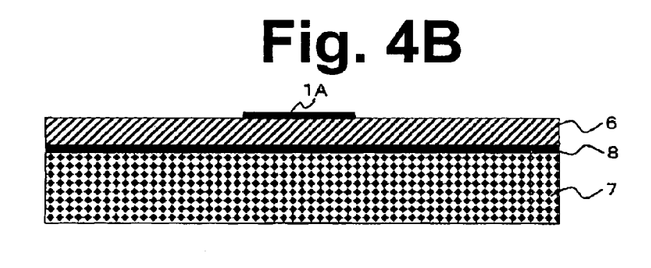
Figure 4C:
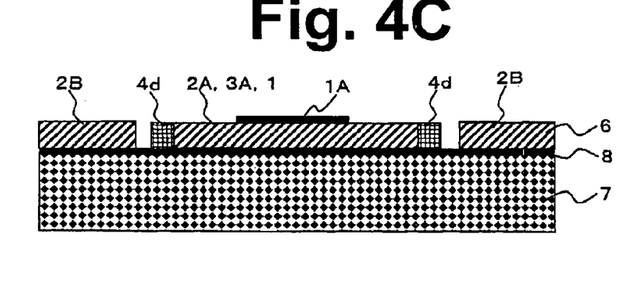
Figure 4D:
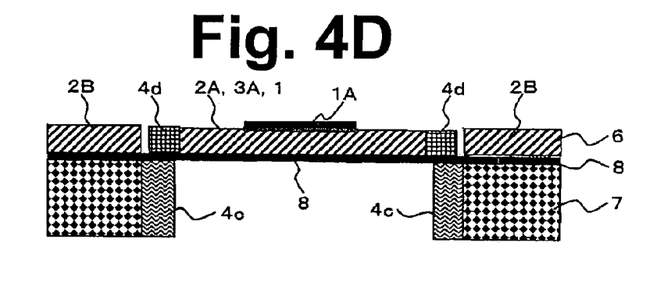
Figure 4E:
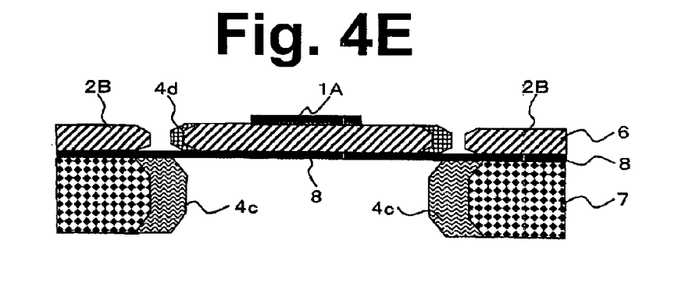
Figure 4F:
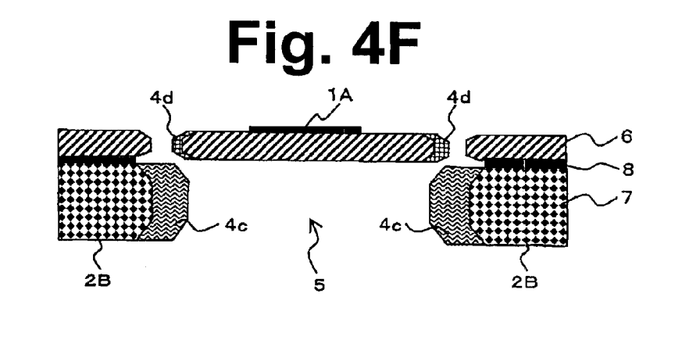

According to the first embodiment, a sequence may be reversed between the anisotropic etching processing shown in FIG. 2E and the processing for removing the insulating layer shown in FIG. 2F, as shown in FIGS. 4E and 4F. With this, although the insulating layer 8 cannot be extended, at least the boundary parts L1 to L4 can be chamfered. Therefore, the electric discharge can be suppressed like the case according to the first embodiment. FIGS. 4A to 4D are diagrams for illustrating the same processing as that shown in FIGS. 2A to 2D.

When the dry etching for removing the insulating layer is difficult due to the thickness of the silicon layers 6 and 7 and the gap (aspect ratio) of the first to fourth comb electrodes 4A to 4D, processing shown in FIG. 4E may be suitably performed as isotropic wet etching and anisotropic etching may be thereafter performed.

[B] Explanation of Second Embodiment

Figure 5A:
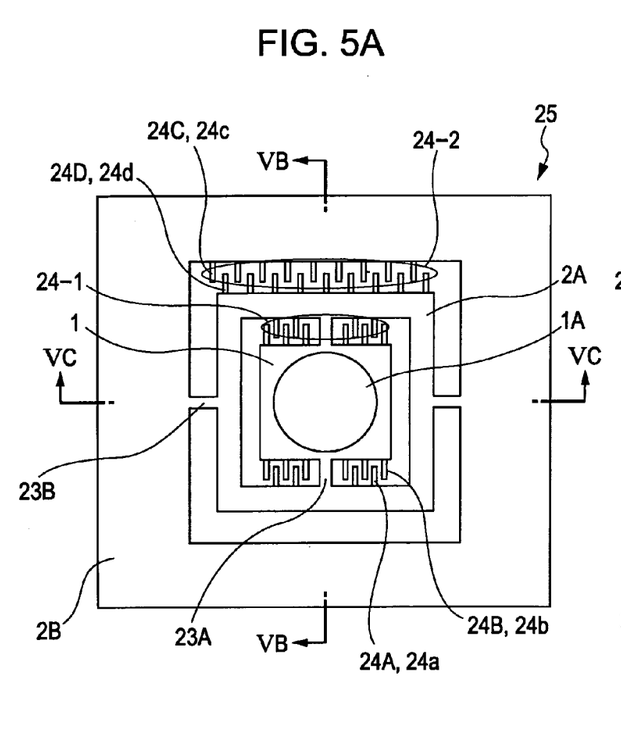
FIGS. 5A to 5E are a diagram showing an MEMS device according to the second embodiment of the present invention.
Figure 5B:
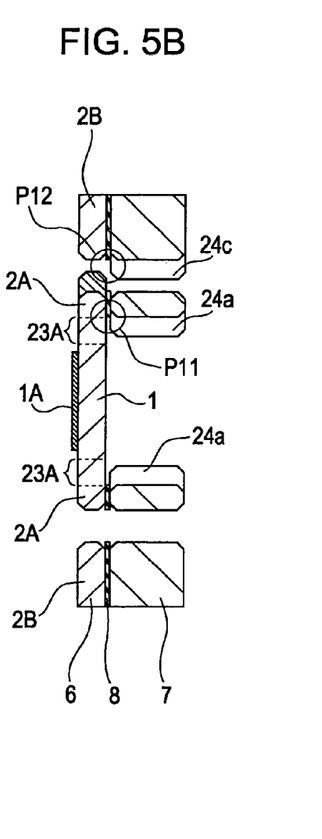
Figure 5C:
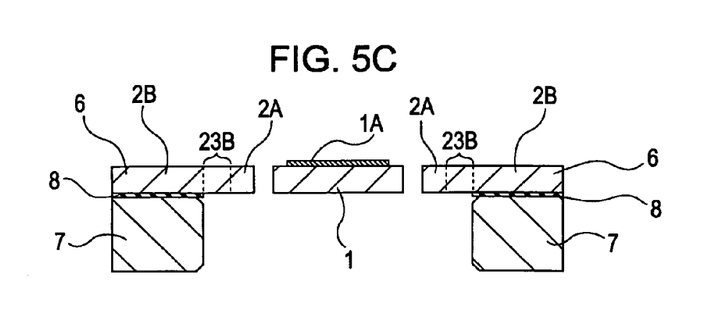
Figure 5D:
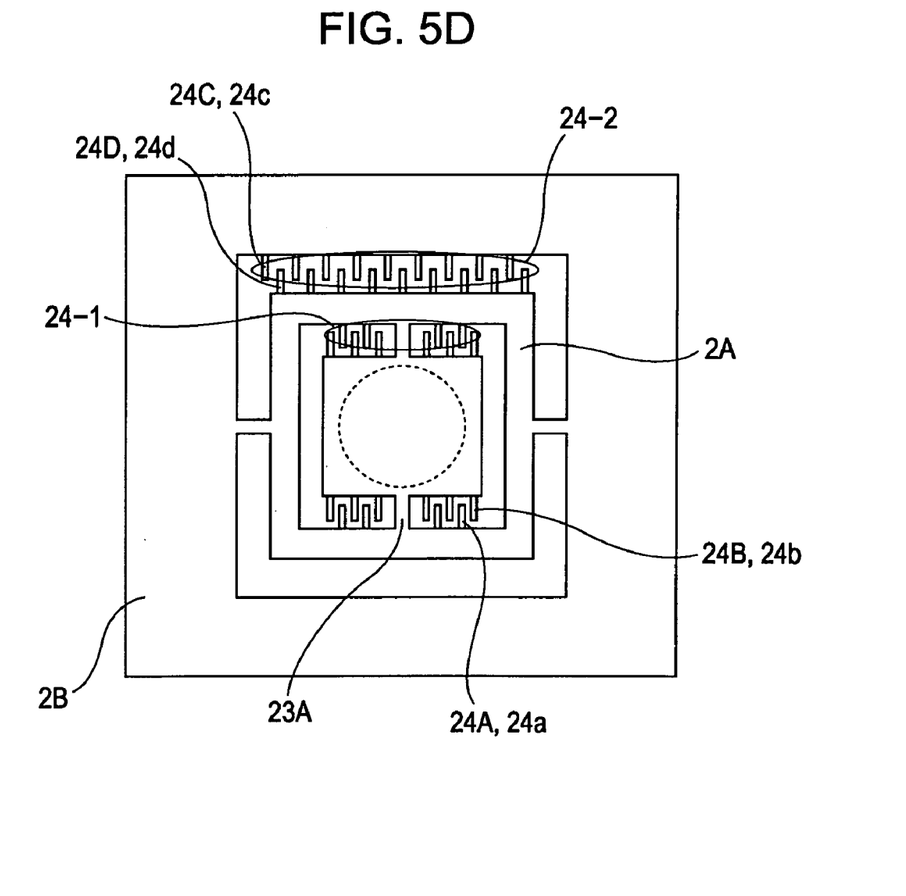
Figure 5E:
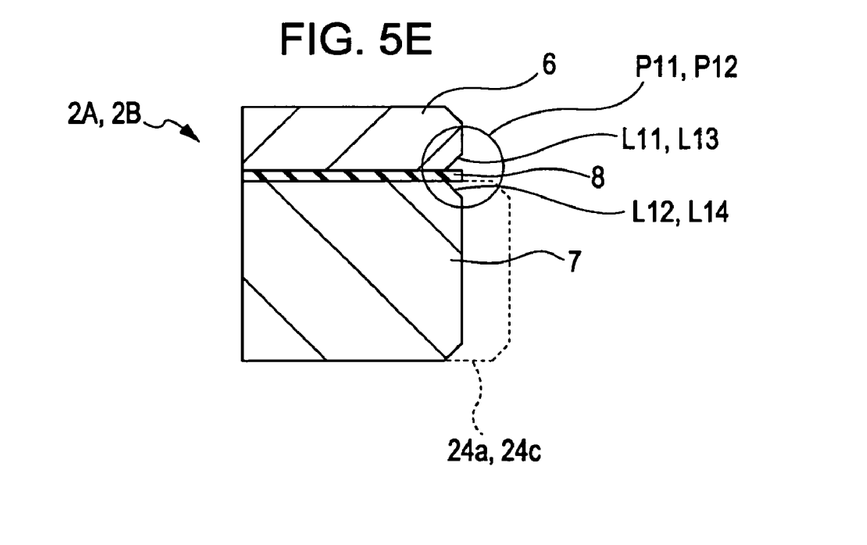

FIGS. 5A to 5F is a diagram showing an MEMS device 25 according to the second embodiment of the present invention. FIG. 5A is a top view thereof, FIG. 5B is a cross-sectional view with AA' in FIG. 5A, FIG. 5C is a cross-sectional view with BB' in FIG. 5A, FIG. 5D is a back view thereof, and FIG. 5E is an enlarged view of portions P11 and P12 in FIGS. 5B and 5C. The MEMS device 25 according to the second embodiment differs from the MEMS device 5 according to the first embodiment in first and second hinge portions 23A and 23B that are formed in parallel with AA' and BB' axes and first and second actuators 24-1 and 24-2. Incidentally, other structures and manufacturing processing are fundamentally the same as those according to the first embodiment and the same reference numerals FIGS. 5A to 5D as those in FIGS. 1A to 1D denote the same portions.

The first actuator 24-1 generates electrostatic force (in the direction vertical to the substrates face) for rotating the rotating unit 1 around the first hinge portion 23A as an axis thereof with a voltage supplied. However, unlike the case according to the first embodiment, the first actuator 24-1 comprises a pair of first and second comb electrodes 24A and 24B at positions in parallel with the first hinge portion 23A. In the first and second comb electrodes 24A and 24B, combs 24a and 24b are arranged symmetrically with the first hinge portion 23A. A voltage is supplied between the combs 24a and 24b on one side, and electrostatic force is generated to the first hinge portion 23A, thereby rotating the rotating unit 1 around the first hinge portion 23A as an axis thereof.

The second actuator 24-2 generates electrostatic force for rotating the rotating unit 1 around the second hinge portion 23B as an axis thereof with a voltage supplied. The second and first frame portions 2B and 2A have third and fourth comb electrodes 24C and 24D with the same structure as that (refer to FIGS. 4C and 4D) shown according to the first embodiment.

That is, the first to fourth comb electrodes 24A to 24D forming the first and second electrode portions are arranged substantially in the direction (arrangement direction) in parallel with the rotating unit 1. According to the second embodiment, the pair of the first and second comb electrodes 24A and 24B is formed on both sides of the rotating unit 1. However, unlike first embodiment, the pair of the third and fourth comb electrodes 24C and 24D is formed on one side of the rotating unit 1, instead of both sides thereof.

As shown in FIG. 5E, also in the MEMS device 25 according to the second embodiment, in the edge area having the first comb electrode 24A as the first actuator 24-1 of the first frame portion 2A, a first boundary part L11 between the first silicon layer 6 and the insulating layer 8 and a second boundary part L12 between the second silicon layer 7 and the insulating layer 8 are chamfered.

Similarly, in the edge area having the second actuator 24-2 of the second frame portion 2B, a third boundary part L13 between the first silicon layer 6 and the insulating layer 8 and a fourth boundary part L14 between the second silicon layer 7 and the insulating layer 8 are chamfered.

Thus, similarly to the first embodiment, it is possible to suppress the generation of electric discharge upon applying the voltage to the first to fourth comb electrodes 24A to 24D and make the rotating operation of the rotating unit 1 stable.

Further, the insulating layer 8 in the edge area having the first comb electrode 24A forming the first actuator 24-1 of the first frame portion 2A is extended to the rotating unit 1 from the first and second boundary parts L11 and L12 chamfered. Furthermore, the insulating layer 8 in the edge area having the second actuator 24-2 of the second frame portion 2B is extended to the rotating unit 1 from the third and fourth boundary parts L13 and L14 chamfered.

Accordingly, upon applying the potential difference between the first and second silicon layers 6 and 7 close to each other sandwiching the insulating layer 8, the boundary parts L11 to L14 are chamfered. In addition, the insulating layer 8 is extended and it is therefore possible to improve the insulating advantage and suppress the above-mentioned electric discharge more effectively.

Further, in the MEMS device 25 according to the second embodiment, the combs 24a to 24d forming the first to fourth comb electrodes 24A to 24D are in the crystal orientation of silicon. That is, it is possible to precisely and uniformly form at least the chamfering surfaces at the boundary portions L11 and L12 in the edge area of the first frame portion 2A where the first comb electrode 24A is formed and the chamfering surfaces at the boundary portions L13 and L14 in the edge area of the second frame portion 2B where the third comb electrode 24C is formed. Therefore, also upon requiring severe accuracy so as to shape the combs on design, it is expectable to stabilize the chamfering shape.

With the MEMS device 25 according to the second embodiment, in addition to the advantages similar to those according to the first embodiment, even upon requiring the severe accuracy for shaping the combs on design, advantageously, it is expectable to stabilize the chamfering shape.

[C] Others

The present invention is not limited to the embodiments and can be variously modified without departing the essentials of the spirit of the present invention.

For example, according to the embodiments, the description is given of the MEMS devices 5 and 25 in which the rotating unit 1 can be rotated in the two-dimensional direction with the first and second hinge portions 3A, 23A, 3B, and 23B. However, the present invention is not limited to this and the similar chamfering structure can be applied to an MEMS device in which at least a structure corresponding to the rotating unit 1 is rotated in the one-dimensional direction. With this, it is possible to suppress the generation of the discharge and stabilize the rotating operation of the rotating unit.

In addition, it is possible to manufacture the device according to the present invention by disclosure of the embodiment by a person skilled in the art.

The turn of the embodiments isn't a showing the superiority and inferiority of the invention. Although the embodiments of the present inventions have been described in detail, it should be understood that the various changes, substitutions, and alterations could be made hereto without departing from the spirit and scope of the invention.

What is claimed is:

1. A micro electro mechanical systems (MEMS) device including a substrate laminated a first silicon layer, a second silicon layer and an insulation layer between the first silicon layer and the second silicon layer, the MEMS device comprising:
   a rotating unit having the first silicon layer;
   a first hinge supporting to rotate the rotating unit;
   a first frame having the first silicon layer, the second silicon layer and the insulation layer, the first frame arranged around an outer circumference of the rotating unit, the first frame supporting the rotating unit with the first hinge;
   a first side surface formed on the first silicon layer of the rotating unit opposite side of the first silicon layer of the first frame;
   a second side surface formed on the second silicon layer of the first frame opposite side of the rotating unit;
   a first actuator having in a pair of a first electrode and a second electrode, the first actuator generating electrostatic force for rotating the rotating unit by driving voltage, the first electrode arranged on the first side surface of the rotating unit, the second electrode arranged on the second side surface of the first frame;

a first junction area formed on an edge of the second silicon layer of the first frame by the side of the insulation layer, the first junction area chamfered; and a second junction area formed on an edge of the first silicon layer of the first frame by the side of the insulation layer, the second junction area chamfered.

2. The MEMS device of the claim 1, wherein the insulation layer extend along to the rotating unit.

3. The MEMS device of the claim 1 further comprising:
a second hinge supporting to rotate the first frame;
a second frame arranged around an outer circumference of the first frame, the second frame supporting the rotating unit with the second hinge, the second frame having the first silicon layer, the second silicon layer and the insulation layer;
a third side surface formed on the first silicon layer of the first frame opposite side of the second frame;
a fourth side surface formed on the second silicon layer of the second frame opposite side of the first frame;
a second actuator having in a pair of a third electrode and a fourth electrode, the second actuator generating electrostatic force for rotating the first frame by driving voltage, the third electrode arranged on the third side surface of the first frame, the fourth electrode arranged on the fourth side surface of the second frame;
a third junction area formed on an edge of the second silicon layer of the second frame by the side of the insulation layer, the third junction area chamfered; and
a fourth junction area formed on an edge of the first silicon layer of the second frame by the side of the insulation layer, the fourth junction area chamfered.

4. The MEMS device of the claim 3, wherein the third electrode and the fourth electrode are a plurality of comb electrodes.

5. The MEMS device of the claim 1, wherein the first electrode and the second electrode are a plurality of comb electrodes.

6. The MEMS device of the claim 1, wherein the first electrode and the second electrode are arranged in the direction of perpendicular to a rotation direction of the rotating unit.

7. The MEMS device of the claim 1, wherein the third electrode and the fourth electrode are arranged in the direction of perpendicular to a rotation direction of the first frame.

8. The MEMS device of the claim 1, wherein the rotating unit has a mirror on a surface of the rotating unit.

9. A manufacturing method for MEMS device including a substrate laminated a first silicon layer, a second silicon layer and an insulation layer between the first silicon layer and the second silicon layer, the manufacturing method comprising:
forming a rotating unit, a hinge and a first frame, respectively, on the first silicon layer of the substrate, the hinge supporting to rotate the rotating unit, the first frame arranged around an outer circumference of the rotating unit;
eliminating the second silicon layer on the rotating unit;
forming a first actuator on a side face of the second silicon layer of the first frame, the first actuator generating electrostatic force with electrodes for rotating the rotating unit by driving voltage;
eliminating the insulation layer between the rotating unit and the first frame; and
anisotropic etching edges between the first silicon layer and the second silicon layer of the first frame for chamfering.

10. A manufacturing method for MEMS device including a substrate laminated a first silicon layer, a second silicon layer and an insulation layer between the first silicon layer and the second silicon layer, the manufacturing method comprising:
preparing a first pattern for forming a rotating unit, a hinge and a first frame, respectively, on the first silicon layer of the substrate, the hinge supporting to rotate the rotating unit, the first frame arranged around an outer circumference of the rotating unit;
preparing a second pattern for eliminating the second silicon layer on the rotating unit, and forming a first actuator on a side face of the second silicon layer of the first frame, the first actuator generating electrostatic force with electrodes for rotating the rotating unit by driving voltage;
etching the substrate with the first pattern and the second pattern;
anisotropic etching edges between the first silicon layer and the second silicon layer of the first frame for chamfering; and
eliminating the insulation layer between the rotating unit and the first frame.

* * * * *